(12) United States Patent
Sakio

(10) Patent No.: US 10,886,128 B2
(45) Date of Patent: Jan. 5, 2021

(54) METHOD AND APPARATUS FOR MANUFACTURING VAPOR DEPOSITION MASK

(71) Applicant: HON HAI PRECISION INDUSTRY CO., LTD., New Taipei (TW)

(72) Inventor: Susumu Sakio, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 184 days.

(21) Appl. No.: 16/089,399

(22) PCT Filed: Jul. 28, 2016

(86) PCT No.: PCT/JP2016/072172
§ 371 (c)(1),
(2) Date: Sep. 28, 2018

(87) PCT Pub. No.: WO2017/168774
PCT Pub. Date: Oct. 5, 2017

(65) Prior Publication Data
US 2020/0303179 A1  Sep. 24, 2020

(30) Foreign Application Priority Data

Mar. 28, 2016 (JP) .................................. 2016-064415

(51) Int. Cl.
| | |
|---|---|
| *H01L 21/027* | (2006.01) |
| *H01L 51/56* | (2006.01) |
| *H01L 51/00* | (2006.01) |
| *C23C 16/455* | (2006.01) |
| *H01L 21/67* | (2006.01) |

(52) U.S. Cl.
CPC ...... *H01L 21/027* (2013.01); *C23C 16/45536* (2013.01); *H01L 21/67017* (2013.01); *H01L 51/0014* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 2013/0197126 A1 | 8/2013 | Vogt | |
| 2015/0050767 A1* | 2/2015 | Kuriyama | ............... H01L 51/56 438/34 |
| 2016/0301036 A1* | 10/2016 | Han | ...................... C23C 14/042 |
| 2017/0104184 A1* | 4/2017 | Han | ....................... H01L 51/56 |
| 2017/0244036 A1* | 8/2017 | Okawara | ............... C23C 14/042 |
| 2017/0358746 A1* | 12/2017 | Lee | .......................... H01L 51/56 |

(Continued)

FOREIGN PATENT DOCUMENTS

JP    2013-165958 A    8/2013

*Primary Examiner* — Asok K Sarkar
(74) *Attorney, Agent, or Firm* — ScienBiziP, P.C.

(57) ABSTRACT

A material of the vapor deposition mask that a resin film layer is disposed on a surface of a metal film layer on which one or more openings are formed is welded on a metal frame in a manner so that the resin film layer faces outward under a condition that a predetermined tension is applied in a predetermined direction; the metal frame is held on a base mount; a taper forming member/material having a reflection surface or the like is disposed to facing the metal film layer which is inward of the metal frame; laser beams are irradiated from above the resin film layer.

9 Claims, 11 Drawing Sheets

(56) References Cited

U.S. PATENT DOCUMENTS

2018/0277799 A1\* 9/2018 Ikenaga ................... C23C 14/24
2019/0044070 A1\* 2/2019 Nishida ................... C23C 14/24
2019/0055640 A1\* 2/2019 Sakio .................... C23C 14/042

\* cited by examiner

METHOD AND APPARATUS FOR MANUFACTURING VAPOR DEPOSITION MASK

TECHNICAL FIELD

The present invention relates to, for example, a method and an apparatus for manufacturing a vapor deposition mask used for manufacturing an organic light emitting diode (OLED: Organic Light Emitting Diode).

BACKGROUND ART

An organic light emitting diode so-called bottom emission type structure is configured of a lamination of transparent electrodes (anodes), a hole injection layer, a hole transport layer, light emitting layers, an electron transport layer, an electron injection layer, metal electrodes (cathodes) and so on. In addition, in a top emission type one, reflective electrodes (anodes), a hole injection layer, a hole transport layer, light emitting layers, an electron transport layer, an electron injection layer, metal electrodes (cathodes) of semi-transparent extremely thin and so on are laminated on a substrate made of a glass plate, a polyimide film of brownish-red or the like, which are not necessarily transparent. As shown in FIG. 9, an apparatus 130 of manufacturing a bottom emission type organic light emitting diode, which is general for industrially manufacturing the organic light emitting diode by vapor deposition, comprises a substrate holder 132 for holding a transparent substrate 131, on which transparent electrodes are formed on a vapor deposition target surface, so that the vapor deposition target surface faces downward, a driving mechanism (not shown) for rotating or translating the substrate holder 132 or vapor deposition sources 133 at a constant speed in a predetermined direction, and a plurality of point-like or linear vapor deposition sources provided so as to face the vapor deposition target surface of the transparent substrate held on the substrate holder in a bottom portion in a vacuum chamber. In each of a plurality of the vapor deposition sources 133, a deposition material for forming the hole injection layer, the hole transport layer, the light emitting layers, the electron transport layer, the electron injection layer, the metal electrodes, and so on is contained.

Vapor deposition masks 110 corresponding to patterns of respective layers are prepared in the inside of the vacuum chamber used to deposit the materials of the above mentioned respective layers. For forming each layer, it is exchanged to a vapor deposition mask corresponding to the layer to be formed. In case of a full color organic light emitting diode without using a color filter, in order to deposit light emitting layers corresponding to colors of R (red), G (green) and B (blue), vapor deposition masks having openings corresponding to the patterns of respective colors are provided. When a light emitting layer of each color is formed, it is exchanged to a vapor deposition mask corresponding to the color. The vapor deposition mask needs to be closely attached to the vapor deposition target surface of the transparent substrate held on the substrate holder. The most common conventional vapor deposition mask is a metal mask having openings of a predetermined pattern formed thereon, and the substrate is closely attracted to and held on the vapor deposition target surface of the transparent substrate by a magnetic force of a magnet provided in the back side of the holder, that is, in the side opposite to the transparent substrate held on the substrate holder.

Along with the high resolution and high definition of such an organic light emitting diode, a vapor deposition mask used for manufacturing the organic light emitting diode tends to be transformed from one formed by etching a thin metal plate in two steps to a hybrid-type vapor deposition mask having a resin film formed of a thermosetting resin such as polyimide or the like and a metal film layer supporting the resin film layer. For example, as shown in FIG. 10, according to a conventional method for manufacturing a vapor deposition mask 110 described in Patent Literature 1, a resist film 113 is spread on a non-resin film side of a metal film layer 111 on which a resin film layer 112 is formed on a surface thereof, a mask 114 is disposed on the resist film 113, ultraviolet rays 115 are irradiated to form a predetermined resist pattern 116. Then, an etching processing is performed to form slits 117 in the metal film layer 111, and laser beams 119 are irradiated to the metal film layer 111 through the slits 117 to form a lot of through holes 118 corresponding to a thin film pattern of an organic light emitting diode.

Generally, a thickness of the resin film layer 112 is about several μm, and a thickness of the metallic film layer 111 is also about several tens μm. On the other hand, a size of the vapor deposition mask becomes 925 mm×1500 mm in the case of a large one. Therefore, it is practically impossible to handle such a vapor deposition mask 110 independently, so that it is treated to be welded to a rectangular metal frame 120 which is larger than and has higher rigidity than those of the vapor deposition mask 110 while a tension is applied to the metallic film layer 111. In addition, as shown in FIG. 11, at a time to irradiate the laser beams 119 to the resin film layer 112, it is placed in a manner so that the resin film layer 112 faces downward and the metal film layer 111 faces upward, a condenser lens 121 and a mask 122 for manufacturing a vapor deposition mask are arranged above the metal film layer 111, and thus, a parallel laser flux 123 is irradiated perpendicular to the mask 122 for manufacturing the vapor deposition mask from above.

In the hybrid-type vapor deposition mask, since the metal film layer 111 is welded to the metal frame 120 with tension applied thereto, the metal frame 120 is slightly deflected and the through holes 118 of the resin film layer 112 are formed with a predetermined accuracy under a state that the metal frame 120 is deflected. However, as mentioned above, in the apparatus 130 for manufacturing the bottom emission type organic light emitting diode, the substrate holder 132 is positioned in an upper portion of the vacuum chamber, and the vapor deposition sources 133 are provided in a lower portion of the vacuum chamber. Then, under a condition that the transparent substrate 131 is held on the substrate holder 132 so that the vapor deposition target surface thereof faces downward, the vapor deposition mask 110 together with the metal frame 120 is attracted to and held on the substrate holder 132 by a magnetic force in a manner so that the non-metal mask side of the resin film layer 112 of the vapor deposition mask 110 is in close contact with the vapor deposition target surface. That is, positions of the vapor deposition mask 110 and the metal frame 120 are reversed at the time of manufacturing are upside down as oppose to at the time of using of the vapor deposition mask 110. Therefore, when the vapor deposition mask 110 and the metal frame 120 at the time of manufacturing are reversed upside down (orientation or position of them is changed) from those at the time of using the deposition mask 110, the direction and the amount of the deflection of the metal film layer 111 and the metal frame 120 will vary, and thus, positions of the through holes 118 of the film layer 112 may slightly deviated and the alignment accuracy of the vapor deposition mask 110 with respect to the TFTs (Thin Film Transistors) formed on the vapor deposition target surface of the transparent substrate 131 may decrease. In other words, the inventor noticed that the variations of the direction and the amount of the deflection of the vapor deposition mask due to position reversal at the time of manufacturing and at the time of using deteriorates the alignment accuracy of the mask. If the positions of the through holes 118 formed in the resin film layer 112 with respect to the TFTs deviate, the deposition material adhere to positions different from the positions where the deposition material should adhere, essentially, and it causes deterioration of the quality of the organic light emitting diode manufactured with using the vapor deposition mask 110. In particular, in a high-definition organic light emitting diode, the allowable error of positional deviation of the vapor deposition mask 110 is very small, so that it may be determined as a defective product even if the deviation is only 3 to 5 μm.

Also, as shown in FIG. 11, at the forming of the through holes 118 in the resin film layer 112, since the laser beams 119 are converged with using the condenser lens 121, even if the vapor deposition mask 110 and the metal frame 120 are merely turned upside down, the taper formed at circumferences of the through holes 118 are reverse tapers that the dimensions in the metal film layer 111 side become smaller. Then, such reverse tapers cause occurrence of inner shadows, that is, shadow portions where vapor deposition materials do not adhere or outer shadows that vapor deposition materials adhere to portions where deposition materials should not adhere.

CITATION LIST

Patent Literatures

Patent Literature 1: JP 2013-165958 A

SUMMARY OF INVENTION

The present invention has been conceived to solve the problems of the above-mentioned background arts and purposed to provide a method and an apparatus for manufacturing a vapor deposition mask which enable to form a hybrid-type vapor deposition mask having a resin film layer and a metal film layer in the same orientation and position at the time of manufacturing and at the time of using the vapor deposition mask.

In order to achieve the above-mentioned purposes, a method for manufacturing a vapor deposition mask according to the present invention comprises:

a step for forming a base material of vapor deposition mask in which a resin film layer is disposed on a surface of a metal film layer having one or more openings formed at predetermined positions;

a step for welding the metal film layer of the base material of vapor deposition mask on a metal frame with a predetermined tension applied in a predetermined direction in a manner so that the resin film layer faces outward;

a step for disposing a taper forming member/material on a position facing the metal film layer inward of the metal frame for forming tapers at circumferences of the through holes in a manner so that dimensions in the metal film layer side of through holes to be formed in the resin film layer become larger;

a step for disposing a laser processing mask above the resin film layer for forming the through holes; and a step for forming the through holes in the resin film layer by irradiating laser beams on the resin film layer via the laser processing mask, wherein the through holes are formed in the resin film layer by irradiating the laser beams to the resin film layer, and subsequently, tapers are formed at circumferences of the through holes by a physical phenomenon caused by a reaction of the taper forming member/material and the laser beams passing through the through holes.

It may be configured that the taper forming member/material has a scattering reflection surface to reflect the laser beams passing through the through holes to the resin film layer side.

Alternatively, it may be configured that the taper forming member/material is a photothermal material to convert the laser beams passing through the through holes to heat.

Alternatively, it may be configured that the taper forming member/material is a plasma generation material to generate plasma by reacting with the laser beams passing through the through holes.

An apparatus for manufacturing a vapor deposition mask according to the present invention comprises:

a base mount for holding a metal frame to which a base material of vapor deposition mask is welded with a predetermined tension is applied in a predetermined direction in a manner so that a resin film layer is disposed on a surface of a metal film layer having one or more through holes formed at predetermined positions and the resin film layer faces outward;

a taper forming member/material disposed to face the metal film layer inward of the metal frame, and used to form tapers at circumferences of the through holes to be formed in the resin film layer in a manner so that dimensions in the metal film layer side becomes larger;

a laser processing mask disposed above the resin film layer to form the through holes; and a laser source for irradiating laser beams to the resin film layer through the laser processing mask to form the through holes in the resin film layer, wherein the through holes are formed in the resin film layer by irradiating the laser beams to the resin film layer, and subsequently, tapers are formed at circumferences of the through holes by a physical phenomenon caused by a reaction of the taper forming member/material and the laser beams passing through the through holes.

It may be configured that the taper forming member/material has a scattering reflection surface to reflect the laser beams passing through the through holes to the resin film layer side.

Alternatively, it may be configured that the taper forming member/material is a photothermal material to convert the laser beams passing through the through holes to heat.

Alternatively, it may be configured that the taper forming member/material is a plasma generation material to generate plasma by reacting with the laser beams passing through the through holes.

A method for manufacturing an organic light emitting diode according to the present invention uses a vapor deposition mask formed by one of the above-mentioned method for manufacturing the vapor deposition mask or apparatus for manufacturing the vapor deposition mask.

As described above, according to the method and the apparatus for manufacturing the vapor deposition mask of the present invention, a hybrid-type vapor deposition mask having a resin film layer and a metal film layer can be formed in a manner so that the resin film layer faces outward similar to that at the time of using the vapor deposition mask, so that it is possible to prevent deterioration of positioning accuracy of the vapor deposition mask to the TFTs which are formed on a vapor deposition target surface of a substrate of an organic light emitting diode, in particular, it is possible to manufacture the high-definition organic light emitting diodes effectively.

DESCRIPTION OF INVENTION

Figure 1:
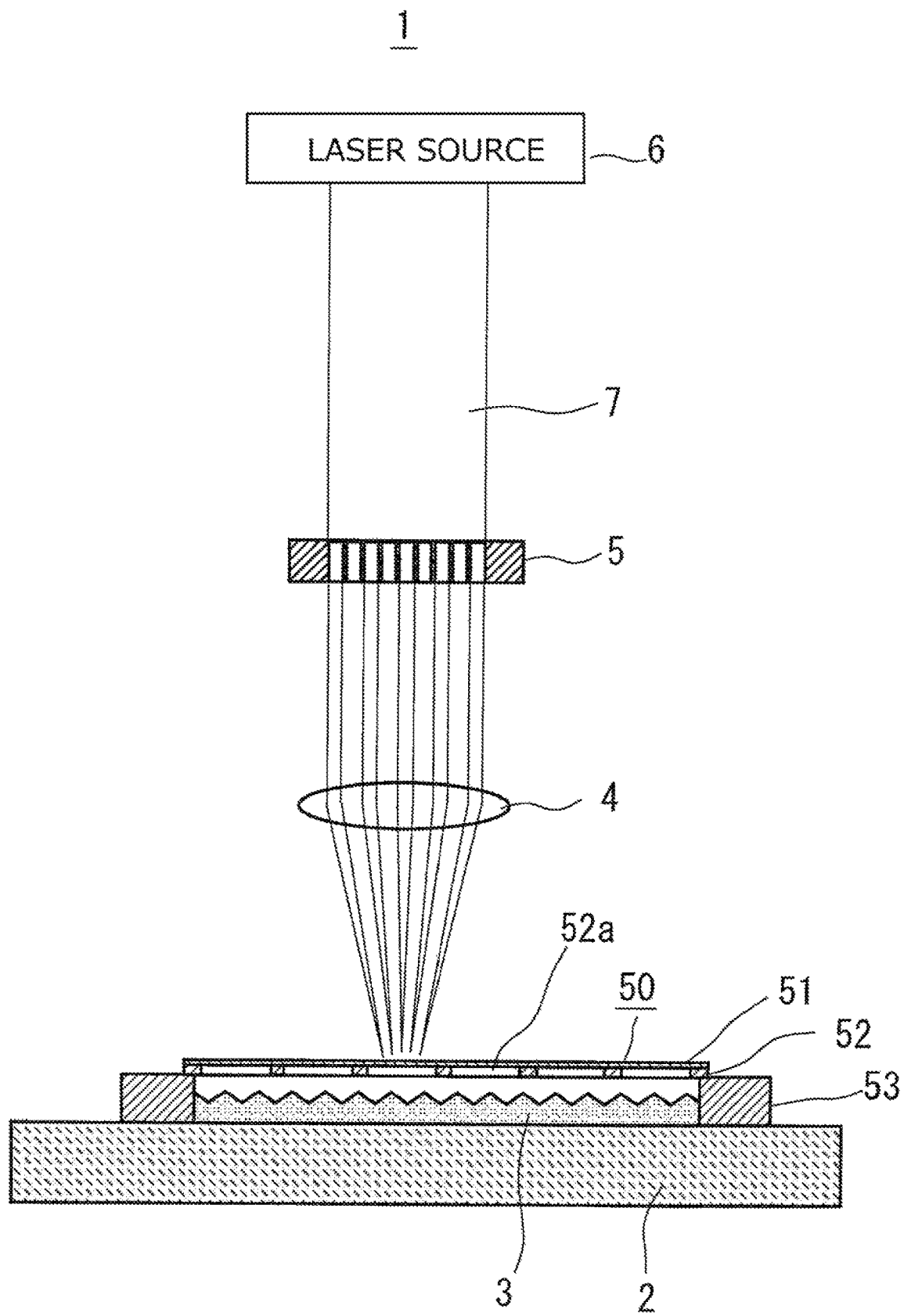
FIG. 1 is a cross-sectional view showing a method and an apparatus for manufacturing a vapor deposition mask according to an embodiment of the present invention.

A method and an apparatus for manufacturing a vapor deposition mask according to an embodiment of the present invention will be described. FIG. 1 shows the method and the apparatus for manufacturing the vapor deposition mask according to the present application. A vapor deposition mask 50, for example, is a so-called hybrid-type vapor deposition mask having a resin film layer 51 formed of a thermosetting resin such as polyimide or the like and a metal film layer 52 formed of a magnetic metal thin film or the like. For example, a thickness of the resin film layer 51 is about several μm to 20 μm, and a thickness of the metal film layer 52 is about several tens μm. On the other hand, a size of the vapor deposition mask 50 is as large as 925 mm×1500 mm or more in the case of a large one. Therefore, it is practically impossible to handle such a vapor deposition mask 50 independently, so that it is treated to be welded to a rectangular metal frame 53 which is larger than and has higher rigidity than those of the vapor deposition mask 50 while a tension is applied to the metallic film layer 52.

An apparatus 1 for manufacturing a vapor deposition mask comprises a base mount 2 for holding the metal frame 53 to which a base material of vapor deposition mask having the resin film layer 51 and the metal film layer 52 is welded, a taper forming member/material 3 disposed on the base mount 2 and inward the metal frame 53, a condenser lens 4 disposed above the resin film layer 51 and converging laser beams 7, which are irradiated substantially perpendicular to the resin film layer 51, on the resin film layer 51, a laser processing mask 5 disposed above the resin film layer 51 and further above the condenser lens 4 and used for forming a plurality of (a lot of) through holes 51a arranged to be a predetermined pattern on the resin film layer 51, and a laser source 6 for irradiating laser beams 7 to the resin film layer 51 via the laser processing mask 5 so as to form the through holes 51a in the resin film layer 51. The method and the apparatus for manufacturing the vapor deposition mask generate various physical phenomena by reacting the taper forming member/material 3 with the laser beams 7, thereby, tapers 51b are formed at circumferences of the through holes 51a in the resin film layer 51 from the metal film layer 52 side in a manner so that dimensions in the metal film layer 52 side become larger. In the configuration example shown in FIG. 1, reflection of the laser beams 7 is utilized as a physical phenomenon.

As the method for manufacturing the vapor deposition mask 50, a base material of vapor deposition mask is formed such that the resin film layer 51 is disposed on a surface of the metal film layer 52 having one or more openings formed at predetermined positions. In the case of forming from the resin film layer 51 without using a commercially available resin film, for example, a resin material is uniformly spread on a glass substrate (not shown) and baked at 400 to 500 degrees Celsius for several hours to obtain the resin film layer 51. Subsequently, while the resin film layer 51 is held on the glass substrate, the metal film layer 52 in which openings are formed so as not to shield the laser beams is adhered thereon. Then, laser beams are irradiated from a backside of the glass substrate to metamorphose an interface between the glass substrate and the resin film layer 51, and a laminated body of the resin film layer 51 and the metal film layer 52 is peeled off from the glass substrate. Then, the laminated body of the resin film layer 51 and the metal film layer 52 is turned upside down and welded to the metal frame 53 while applying a tension to the metal film layer 52 and the resin film layer 51 facing outward. At that time, the taper forming member/material 3, which can serve as a spacer for holding the laminated body of the resin film layer 51 and the metal film layer 52 too, may be mounted on an inside of the metal frame 53 in advance. Details of the taper forming member/material 3 will be described later.

Then, the metal frame 53 to which the laminated body of the resin film layer 51 and the metal film layer 52 are welded and the taper forming member/material 3 are placed on the base mount 2 so that the resin film layer 51 is placed in the upper side. Subsequently, the laser source 6, the condenser lens 4, and the laser processing mask 5 are arranged above the resin film layer 51 so as to face the resin film layer 51, and the laser beams 7 are irradiated to the resin film layer 51 via the laser processing mask 5 and the openings of the metal film layer 52. The resin at the portions irradiated with the laser beams 7 is decomposed and scattered by ablation, and thereby, through holes arranged as a predetermined pattern are formed in the resin film layer 51, and the manufacture of the vapor deposition mask 50 is completed.

Figure 2A:
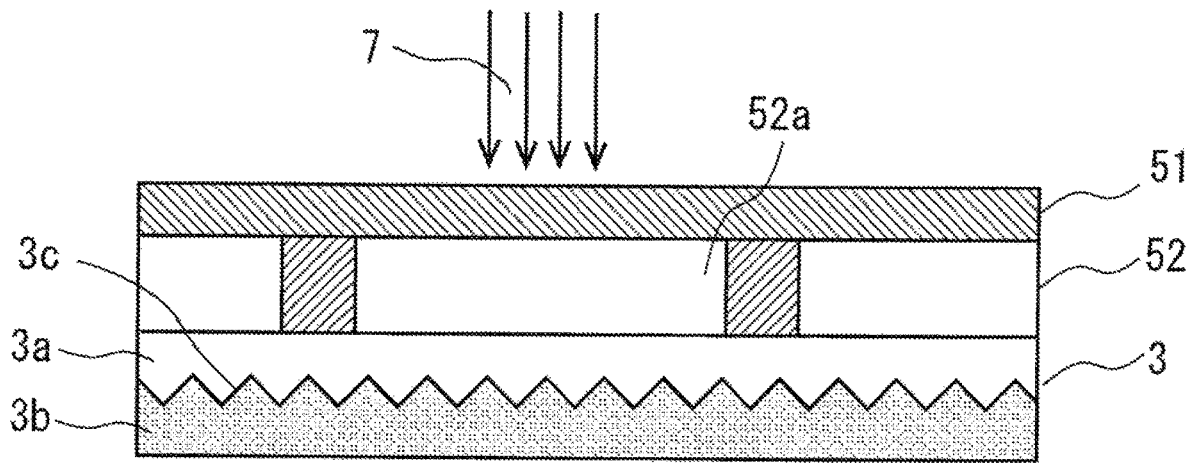
FIGS. 2A to 2C are drawings showing processes for forming through holes in a resin film layer by irradiation of laser beams in the method and the apparatus for manufacturing the vapor deposition mask.
Figure 2B:
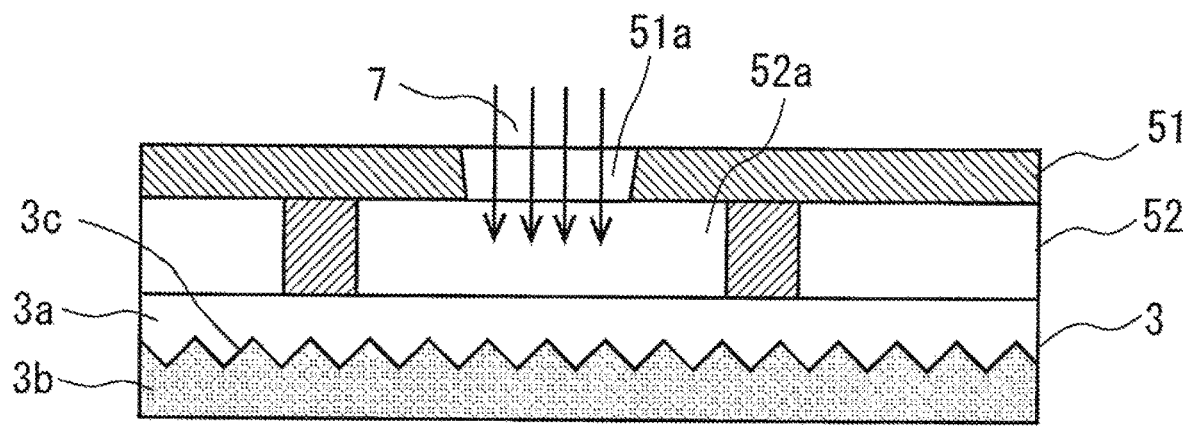
Figure 2C:
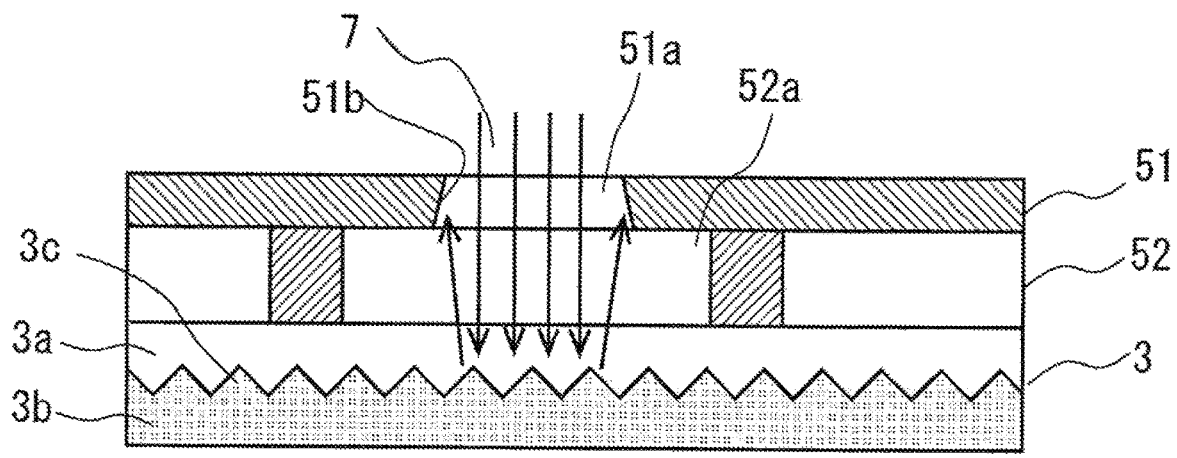

Next, a process of forming the through holes in the resin film layer 51 and a structure and a function of the taper forming member/material 3 will be described with reference to FIGS. 2A to 2C. FIG. 2A shows a state where no through hole is formed in the resin film layer 51, FIG. 2B shows a state where through holes 51a are formed in the resin film layer 51, and FIG. 2C shows a state where tapers 51b are formed at circumferences of the through holes 51a in the resin film layer 51 in a manner so that dimensions in the metal film layer 52 side become larger. As shown by downward arrows in FIGS. 2A to 2C, the laser beams irradiated to the upper surface of the resin film layer 51 are drawn so as to be irradiated perpendicularly for convenience, however, as shown in FIG. 1, they are converged and angled by the condenser lens 4. In addition, one or more openings 52a are formed in the metal film layer 52 in advance. The taper forming member/material 3 is configured of two layers or three layers formed of materials having different refractive indices, for example. A first layer 3a located upside transmits laser beams and a reflection surface 3c for reflecting the laser beams is formed on an interface between the first layer and a second layer 3b located downside. As shown in the drawings, the reflection surface 3c may be a regular one such as pyramids or semicircles or may be a random shape so as to scatter the laser beams. The size of the pyramids is preferably larger than the wavelength of the laser beams, and when a YAG laser with a wavelength of 355 nm is used, it is preferable to be about 0.36 µm or more, for example. The height of concavity and convexity of the reflection surface 3c is preferably 0.05 µm or more, but it may be changed as appropriate according to the distance from the reflection surface 3c to the resin film layer 51, the thickness of the resin film layer 51, and the like. Furthermore, a metal film may be vapor-deposited as the reflection surface 3c.

As shown in FIG. 2A, when the laser beams 7 are irradiated to the upper surface of the resin film layer 51, chemical bonds in constituent molecules of a polymer material constituting the resin film layer 51 are cut off by the light energy, and the resin material in the portions irradiated with the laser beams 7 is decomposed and scattered in a moment by the ablation phenomenon. As shown in FIG. 2B, at the stage where the through holes 51a are formed in the resin film layer 51, since the laser beams 7 are angled as mentioned above, the formed through holes 51a are tapered reversely so that the dimensions in the metal film layer 52 side are smaller. However, as shown in FIG. 2C, since the reflection surface 3c of the taper forming member/material 3 is provided to face the lower surface of the resin film layer 51, the laser beams 7 passed through the through holes 51a are reflected by the reflection surface 3c, and a part of the reflected beams is irradiated to the circumferences of the through holes 51a in the resin film layer 51. Thereby, the resin material at the circumferences of the through holes 51a is decomposed and scattered, and the tapers 51b having larger dimensions in the metal film layer 52 side are formed at the circumferences of the through holes 51a.

The size of the laser processing mask 5 is 40 mm×40 mm, for example. As for the size of the through holes 51a formed in the resin film layer 51, in the case of full high vision of 5.5 inches (400 ppi: pixel per inch), each of the through holes 51a has a rectangular shape of about 30 µm×30 µm, for example. Also, in the case of 4K of 5.5 inch (800 ppi), each of the through holes 51a has a rectangular shape of about 15 µm×15 µm. In addition, when the magnification of the condenser lens 4 is 10 times, the size of the opening for laser processing of the laser processing mask 5 is, for example, 150 µm×150 µm. The laser beams used for forming the through openings 51a in the resin film layer 51, for example, has a wavelength of 266 nm or 355 nm, an energy density of a range 0.1 to 0.5 J/cm$^2$, and such laser pulses are irradiated 10 to 200 shots for one process of forming the opening.

Figure 3:
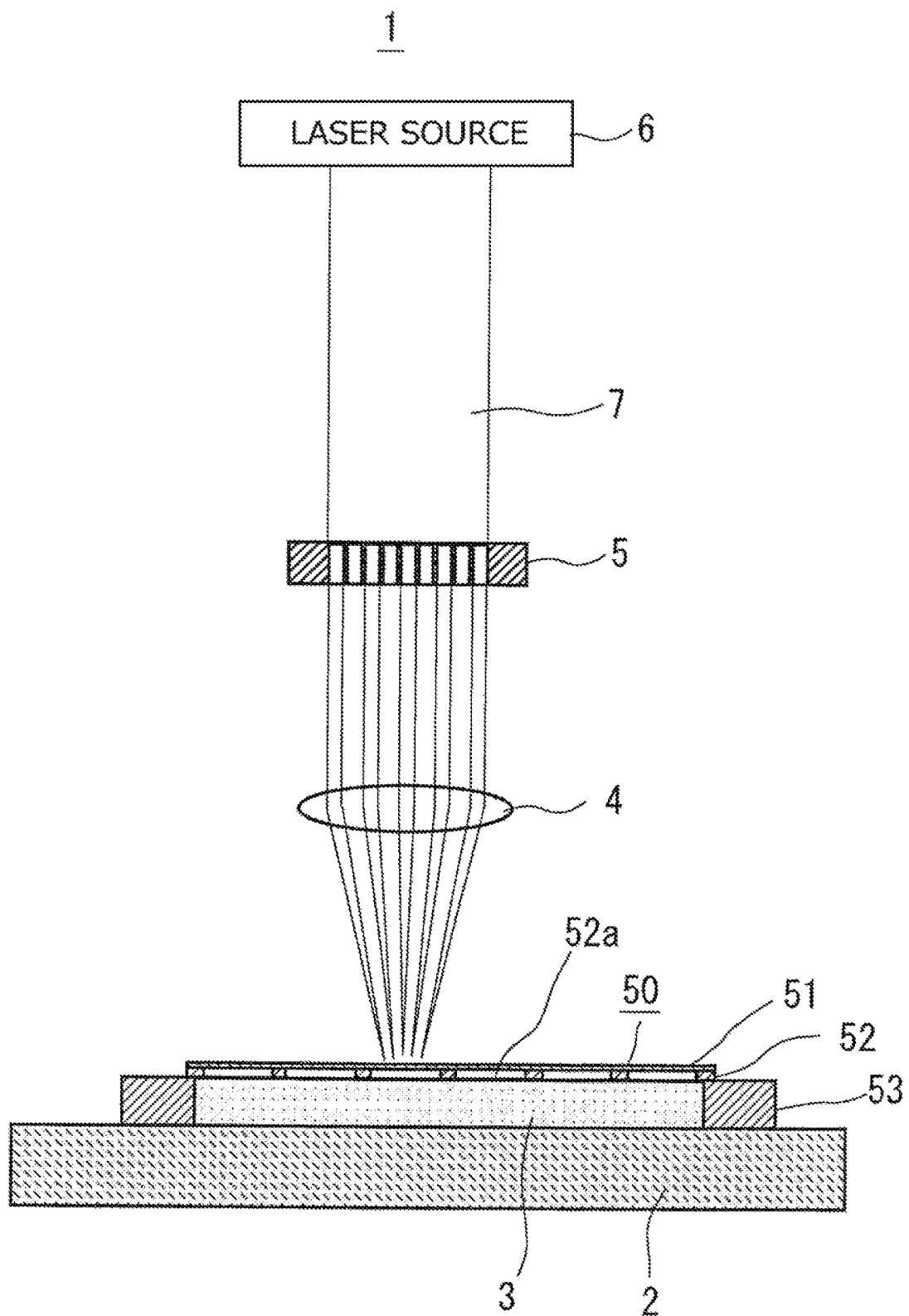
FIG. 3 is a cross-sectional view showing a first modification of the method and the apparatus for manufacturing the vapor deposition mask.
Figure 4A:
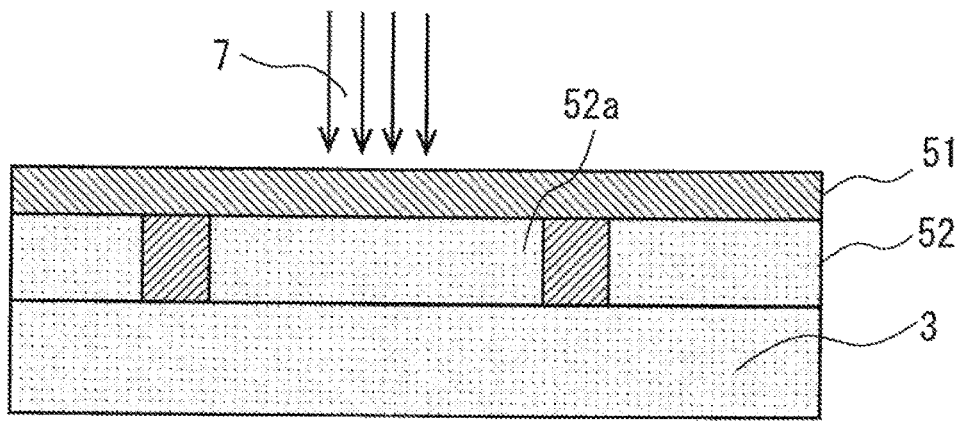
FIGS. 4A to 4C are drawings showing processes for forming through holes in a resin film layer by irradiation of laser beams in the first modification of the method and the apparatus for manufacturing the vapor deposition mask.
Figure 4B:
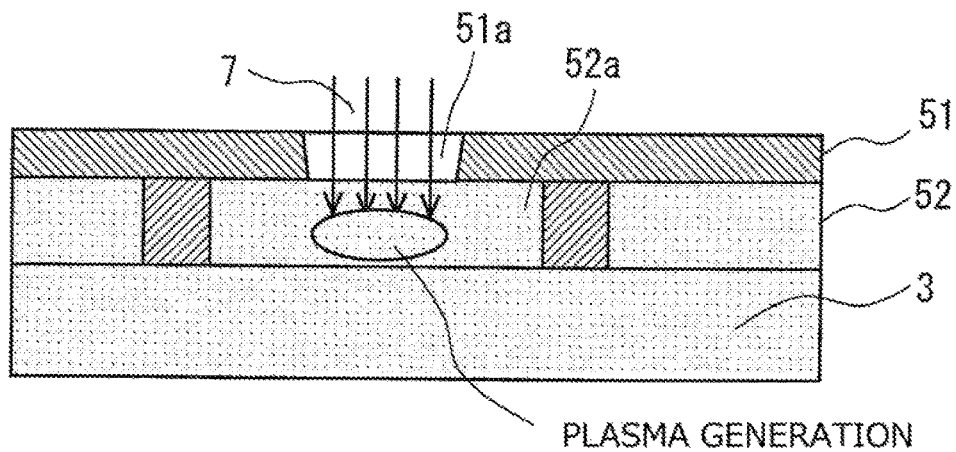
Figure 4C:
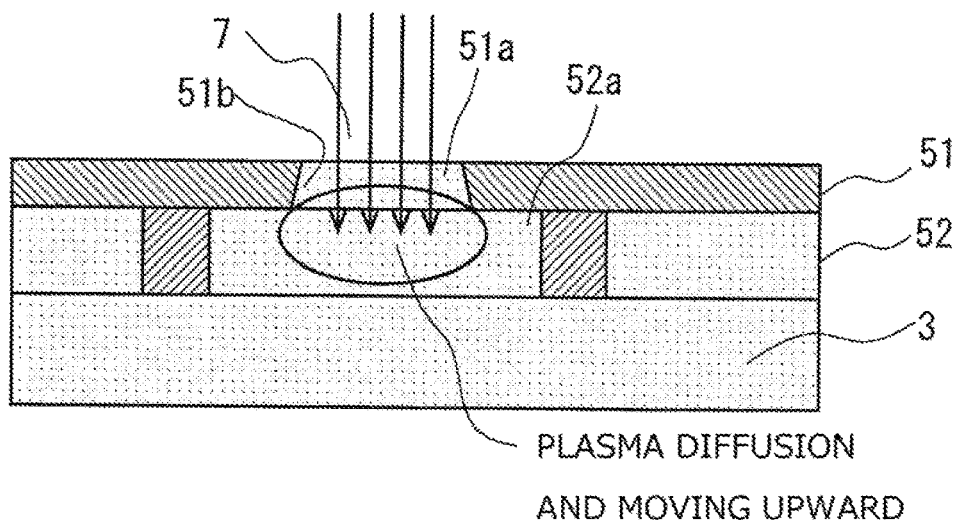

Next, a configuration of a first modification of the method and the apparatus for manufacturing the vapor deposition mask are shown in FIGS. 3 and 4. In this first modification, a gas plasma generating material such as argon or xenon is used as the taper forming member/material 3, and plasma is generated as a physical phenomenon by reaction of the laser beams passing through the through holes 51a with the plasma generating material, subsequent to forming the through holes 51a in the resin film layer 51. Generally, it is known that plasma is generated when various kinds of substances such as gas, solid or gel-like matter are irradiated with laser beams having intensity higher than a threshold value inherent to the substance. In the case that the plasma generating material is a gas, this phenomenon is explained by taking dielectric breakdown as an example. When the laser beams having the intensity exceeding the threshold causing dielectric breakdown are converged by the lens and irradiated to the gas, dielectric breakdown occurs in the vicinity of the convergence point, and plasma is generated by ionization of the gas. The plasmatized gas further ionizes the gas around it, and plasma is gradually diffused. The threshold of the laser power causing dielectric breakdown depends on kind and pressure of the gas. It is known that as the gas pressure rises, the threshold of the laser power causing the dielectric breakdown decreases. In the case of using a gas such as argon or xenon as the taper forming member/material 3, such a gas is filled in a space formed by the metal frame 53 and the base mount 2 at a pressure of one atmosphere or more. Since the plasmatized gas becomes light as temperature rises, it moves upward, that is, toward the through holes 51a side. Then, plasma acts on the resin material of the resin film layer 51, and the tapers 51b are formed at the circumferences of the through holes 51a.

Figure 5:
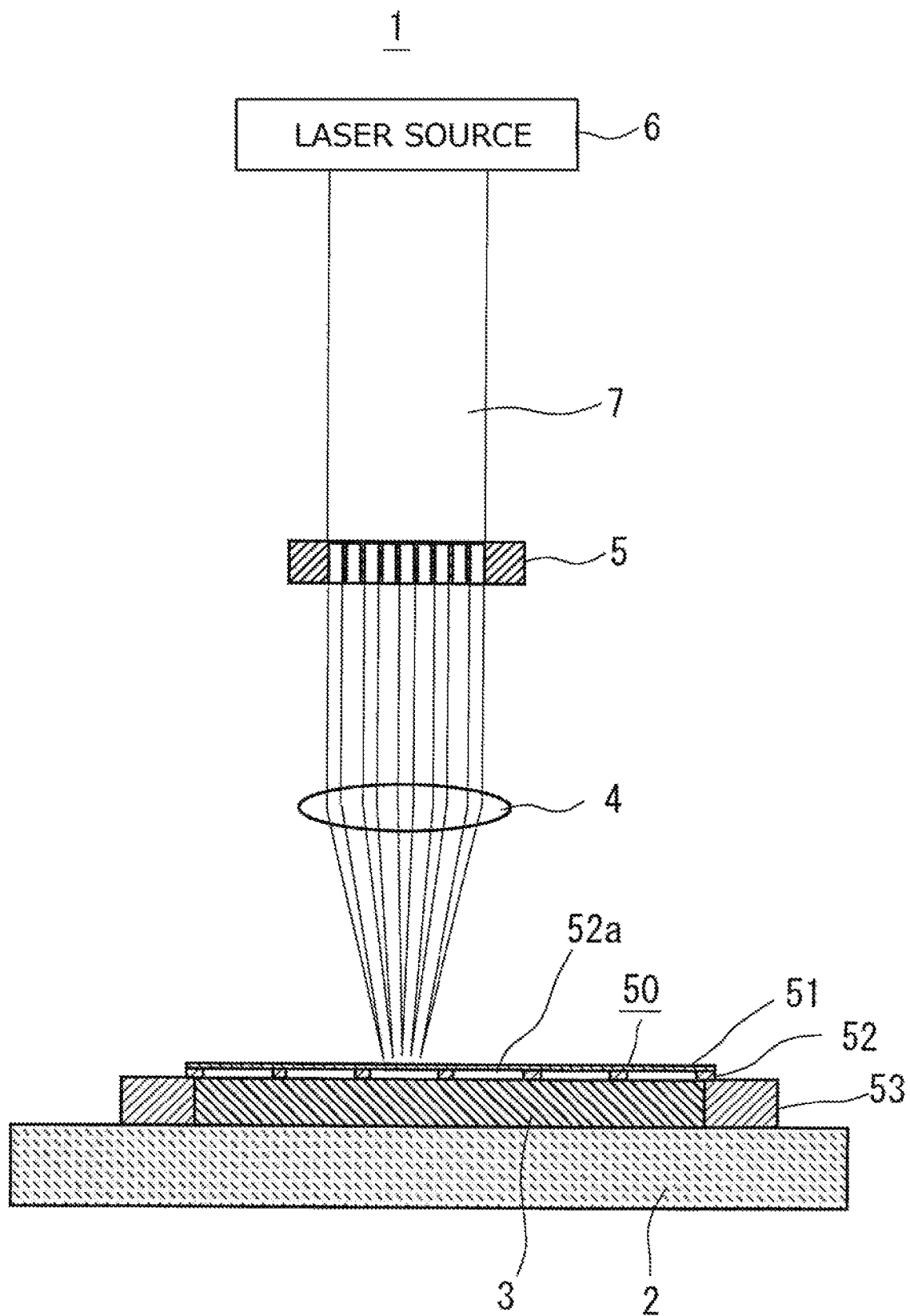
FIG. 5 is a cross-sectional view showing a second modification of the method and the apparatus for manufacturing the vapor deposition mask.
Figure 6A:
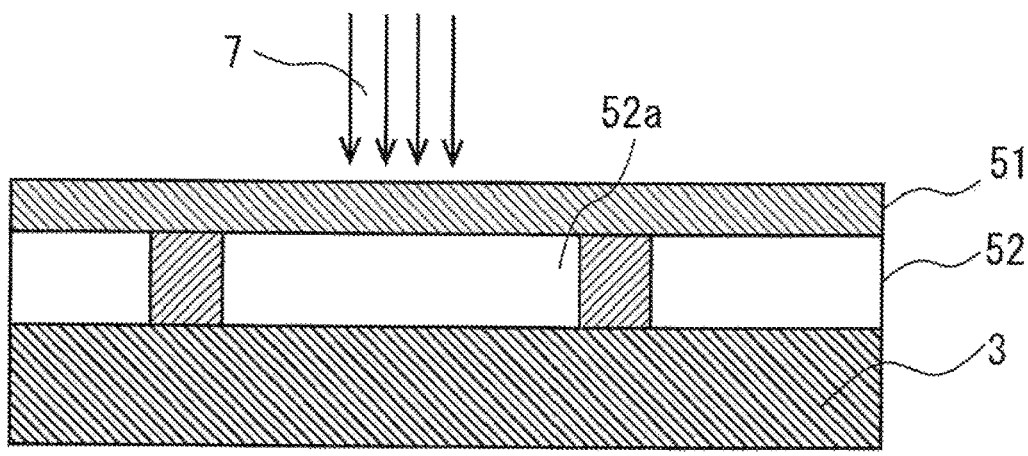
FIGS. 6A to 6C are drawings showing processes for forming through holes in a resin film layer by irradiation of laser beams in the second modification of the method and the apparatus for manufacturing the vapor deposition mask.
Figure 6B:
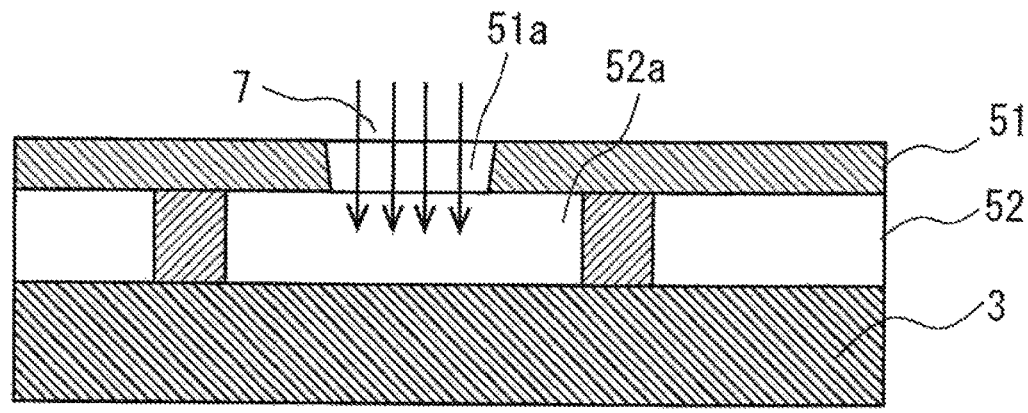
Figure 6C:
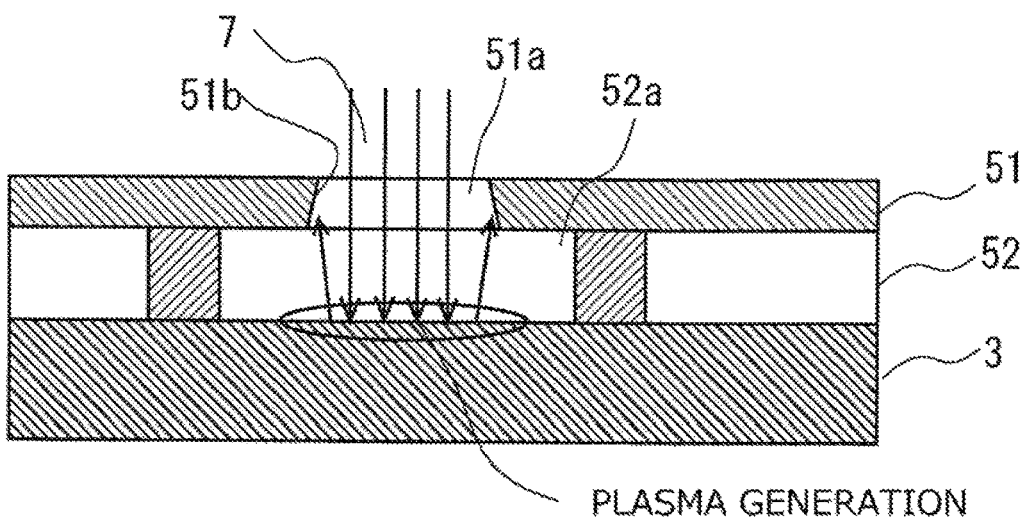

Next, a configuration of a second modification of the method and the apparatus for manufacturing the vapor deposition mask is shown in FIG. 5 and FIG. 6. In this modification, a solid plasma generating material such as a metal is used as the taper forming member/material 3, and plasma is generated as a physical phenomenon by reaction of the laser beams passing through the through holes 51a with the plasma generating material, subsequent to forming the through holes 51a in the resin film layer 51. When a solid such as metal is irradiated with laser beams, most of the laser beams are reflected, but a part of the laser beams is absorbed on a surface of the solid and heats the solid. Although the heated solid is processed by melting and vaporizing, it is ionized in the same way as dielectric breakdown of the gas, and plasma is generated, simultaneously. When plasma is generated on the surface of the plate-shaped plasma generating material, the plasma is ejected in a direction substantially perpendicular to the surface by the pressure thereof. Consequently, plasma acts on the resin material of the resin film layer 51, and the tapers 51b are formed at the circumferences of the through holes 51a.

Figure 7:
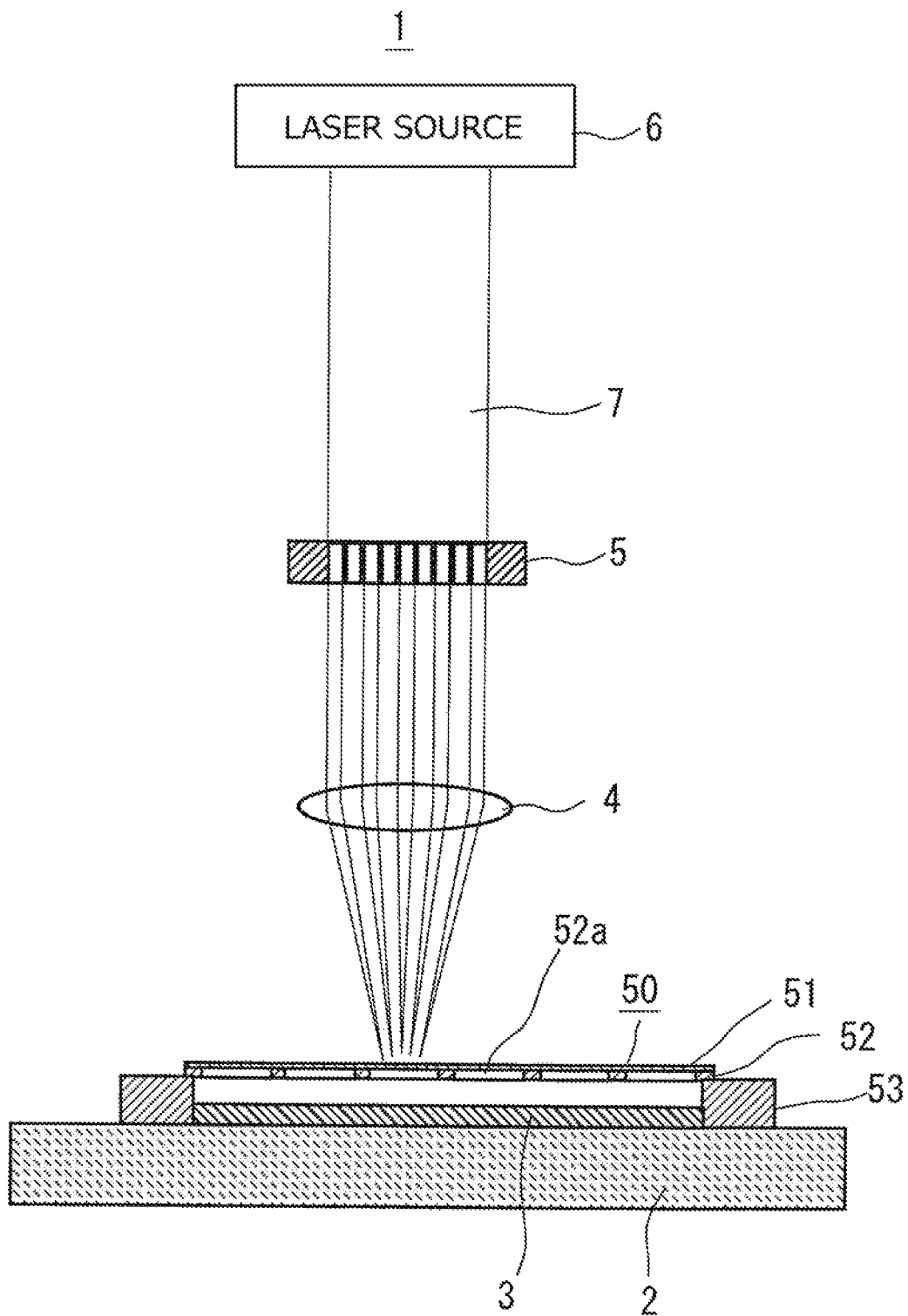
FIG. 7 is a cross-sectional view showing a third modification of the method and the apparatus for manufacturing the vapor deposition mask.
Figure 8A:
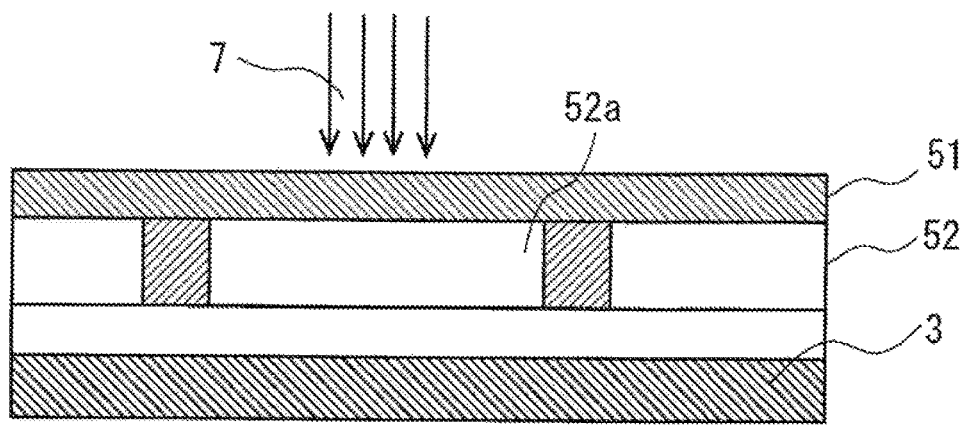
FIGS. 8A to 8C show processes for forming through holes in a resin film layer by irradiation of laser beams in the third modification of the method and the apparatus for manufacturing the vapor deposition mask.
Figure 8B:
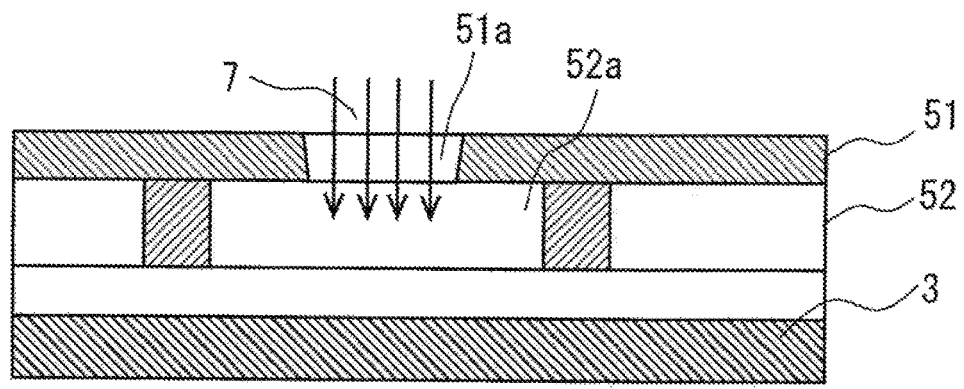
Figure 8C:
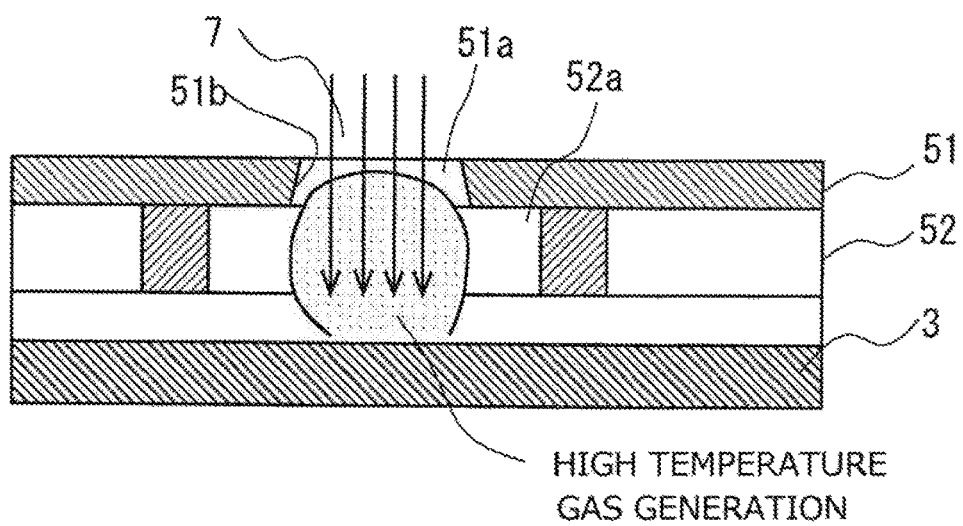
Figure 9:
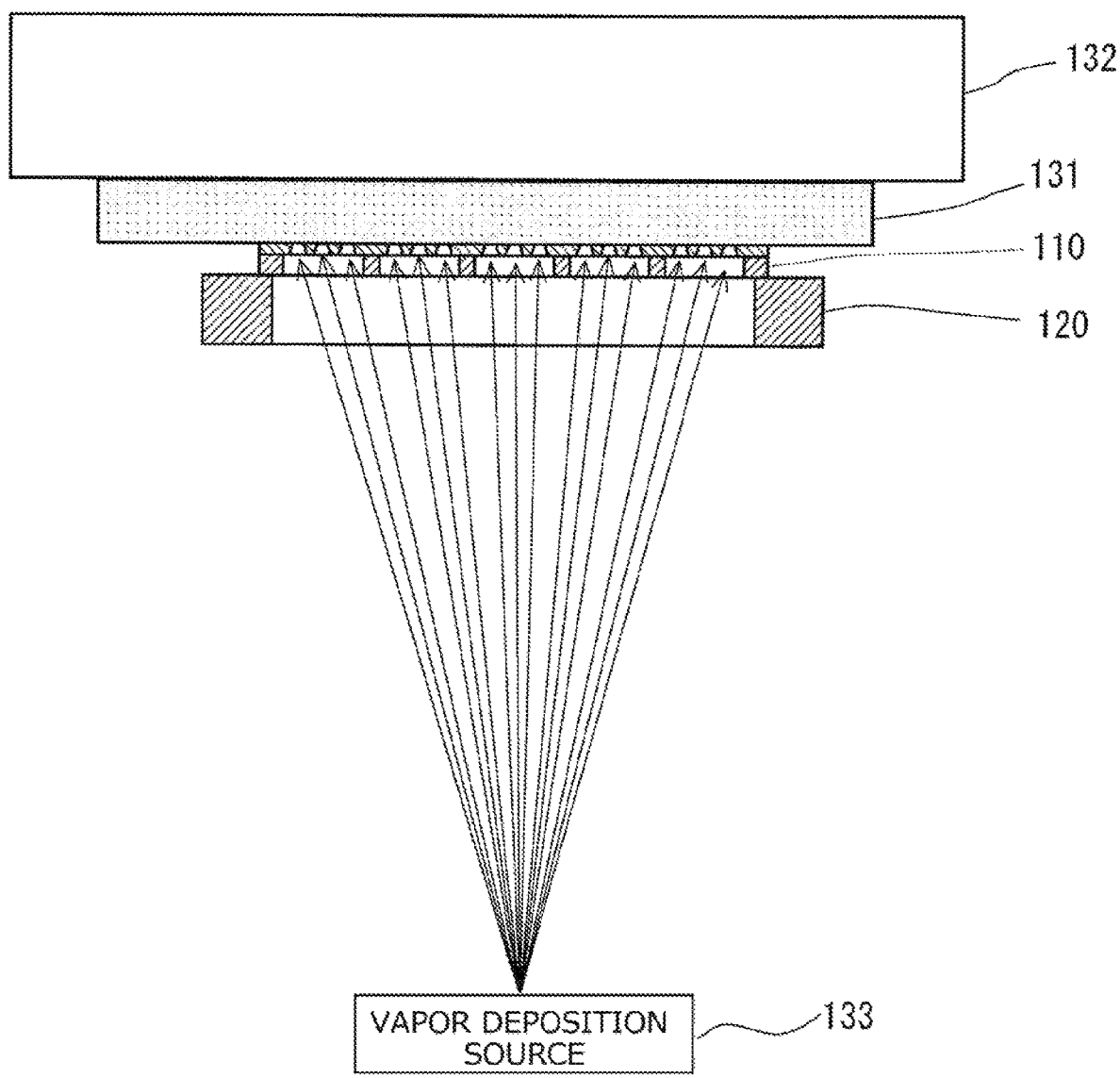
FIG. 9 is a view showing a configuration of a general apparatus for manufacturing a bottom emission type organic light emitting diode.
Figure 10A:
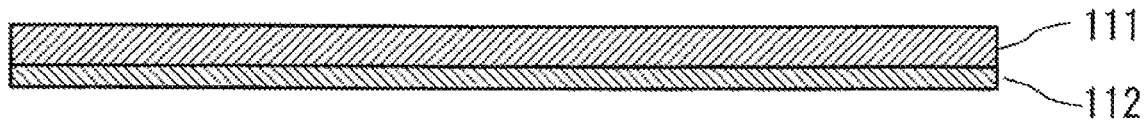
FIGS. 10A to 10E show a conventional method for manufacturing a vapor deposition mask.
Figure 10B:
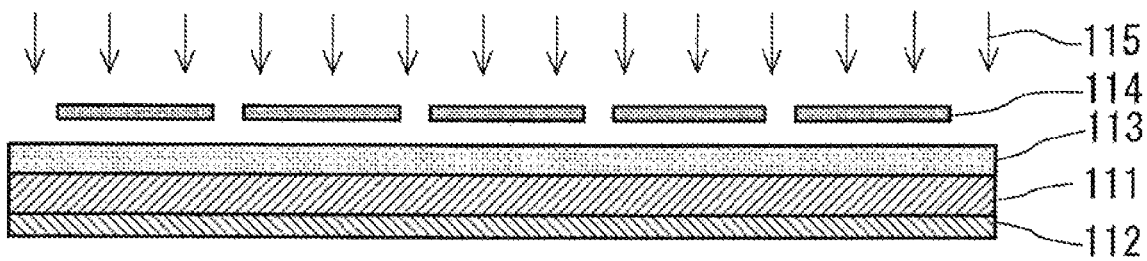
Figure 10C:
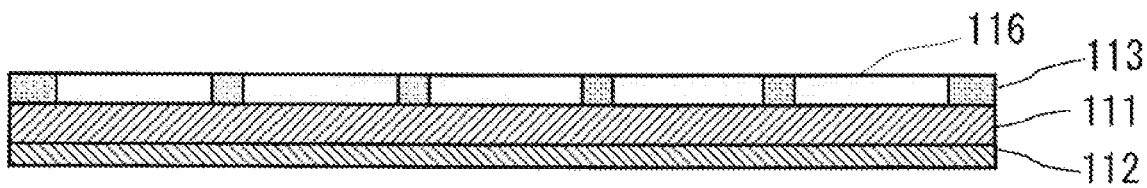
Figure 10D:
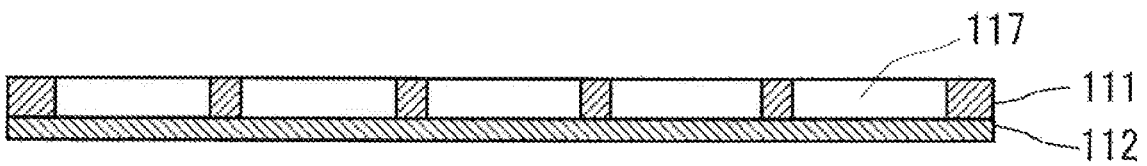
Figure 10E:
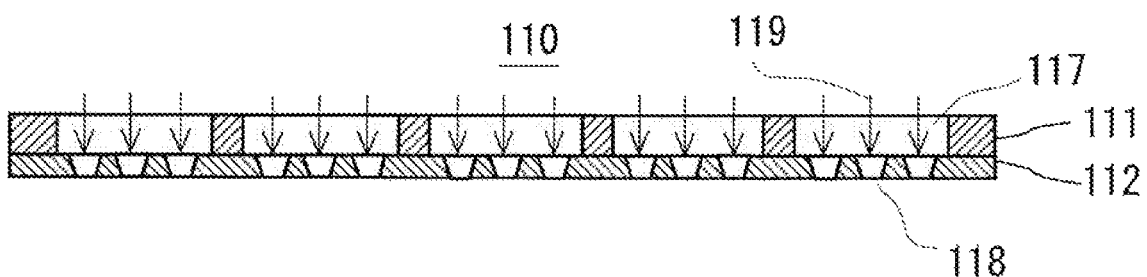
Figure 11:
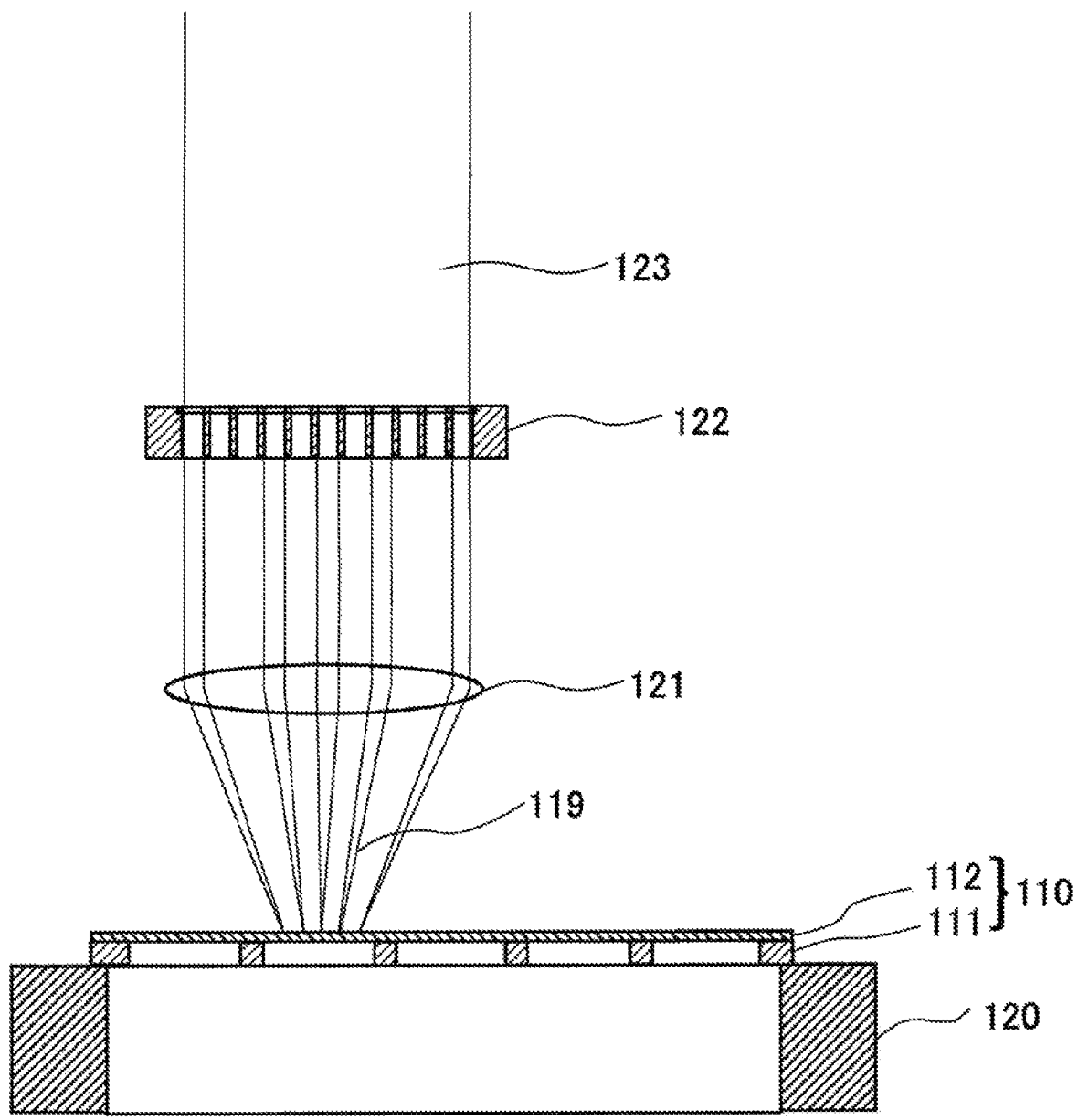
FIG. 11 shows a process for forming through holes in a resin film layer by irradiation of laser beams in a conventional method for manufacturing a vapor deposition mask.

Next, a configuration of a third modification of the method and the apparatus for manufacturing the vapor deposition mask is shown in FIG. 7 and FIG. 8. In this modification, a photothermal conversion material that absorbs the energy of the laser beams and converts it into thermal energy, such as a resin film containing carbon nanotubes, metal nanoparticles or the like, is used as the taper forming member/material 3. As a physical phenomenon, the photothermal conversion material absorbs the energy of the laser beams and converts into thermal energy, so as to be melted and vaporized itself or to heat the surrounding gas. The high temperature gas generated by irradiation of the laser beams acts on the resin material of the resin film layer 51 and the tapers 51*b* are formed at the circumferences of the through holes 51*a* by melting and vaporizing the resin material. In this case, it is not necessary to make the intensity of the laser beams to be irradiated higher than the threshold causing dielectric breakdown.

As mentioned above, according to the method and the apparatus for manufacturing the vapor deposition mask of the present invention, on the occasion of the manufacturing the hybrid-type vapor deposition mask 50 having the resin film layer 51 and the metallic film layer 52, a lot of the through holes 51*a* arranged to be a predetermined pattern can be formed by irradiating the laser beams 7 from the resin film layer 51 side while facing the resin film layer 51 outward, and the tapers 51*b* can be formed at the circumferences of the through holes 51*a* in the resin film layer 51 from the metal film layer 52 side with utilizing reflection of the laser beams 7, plasmatization of the substance by laser beams 7, or heating by absorption of the laser beams 7 as the physical phenomena by reaction of the laser beams 7 passing through the through holes 51*a* with the taper forming member/material 3 placed at the metal film layer 52 side. Therefore, it is possible to manufacture the vapor deposition mask 50 in the same direction or position as that at the time of use, and to prevent deterioration of the alignment accuracy of the vapor deposition mask 50 with respect to the TFTs formed on the vapor deposition target surface of the substrate of the organic light emitting diode, in particular, it is possible to manufacture high-definition organic light-emitting diodes, efficiently.

REFERENCE SIGNS LIST

1: Apparatus for manufacturing a vapor deposition mask
2: Base mount
3: Taper forming member/material
4: Condenser lens
5: Laser processing mask
6: Laser source
7: Laser beams
50: Vapor deposition mask
51: Resin film layer
51*a*: Through holes
51*b*: Taper
52: Metal film layer
52*a*: Opening
53: Metal frame

The invention claimed is:

1. A method for manufacturing a vapor deposition mask comprising:
forming a base material of vapor deposition mask in which a resin film layer is disposed on a surface of a metal film layer having one or more openings formed at predetermined positions;
welding the metal film layer of the base material of vapor deposition mask on a metal frame with a predetermined tension applied in a predetermined direction in a manner so that the resin film layer faces outward;
disposing a taper forming member/material on a position facing the metal film layer inward of the metal frame for forming tapers at circumferences of the through holes in a manner so that dimensions in the metal film layer side of through holes to be formed in the resin film layer become larger;
disposing a laser processing mask above the resin film layer for forming the through holes; and
forming the through holes in the resin film layer by irradiating laser beams on the resin film layer via the laser processing mask, wherein
the through holes are formed in the resin film layer by irradiating the laser beams to the resin film layer, and subsequently, tapers are formed at circumferences of the through holes by a physical phenomenon caused by a reaction of the taper forming member/material and the laser beams passing through the through holes.

2. The method for manufacturing the vapor deposition mask according to claim 1, wherein
the taper forming member/material has a scattering reflection surface to reflect the laser beams passing through the through holes to the resin film layer side.

3. The method for manufacturing the vapor deposition mask according to claim 1, wherein
the taper forming member/material is a photothermal material to convert the laser beams passing through the through holes to heat.

4. The method for manufacturing the vapor deposition mask according to claim 1, wherein
the taper forming member/material is a plasma generation material to generate plasma by reacting with the laser beams passing through the through holes.

5. A method for manufacturing an organic light emitting diode using a vapor deposition mask formed by the method for manufacturing the vapor deposition mask according to claim 1.

6. An apparatus for manufacturing a vapor deposition mask according to the present invention comprises:
a base mount for holding a metal frame to which a base material of vapor deposition mask is welded with a predetermined tension is applied in a predetermined direction in a manner so that a resin film layer is disposed on a surface of a metal film layer having one or more through holes formed at predetermined positions and the resin film layer faces outward;
a taper forming member/material disposed to face the metal film layer inward of the metal frame, and used to form tapers at circumferences of the through holes to be formed in the resin film layer in a manner so that dimensions in the metal film layer side becomes larger;
a laser processing mask disposed above the resin film layer to form the through holes; and
a laser source for irradiating laser beams to the resin film layer through the laser processing mask to form the through holes in the resin film layer, wherein
the through holes are formed in the resin film layer by irradiating the laser beams to the resin film layer, and subsequently, tapers are formed at circumferences of the through holes by a a reaction between the taper forming member/material and the laser beams passing through the through holes.

7. The apparatus for manufacturing the vapor deposition mask according to claim 6, wherein
the taper forming member/material has a scattering reflection surface to reflect the laser beams passing through the through holes to the resin film layer side.

8. The apparatus for manufacturing the vapor deposition mask according to claim 6, wherein
the taper forming member/material is a photothermal material to convert the laser beams passing through the through holes to heat.

9. The apparatus for manufacturing the vapor deposition mask according to claim 6, wherein the taper forming member/material is a plasma generation material to generate plasma by reacting with the laser beams passing through the through holes.

\* \* \* \* \*